United States Patent
Byun et al.

(10) Patent No.: US 10,763,181 B2
(45) Date of Patent: Sep. 1, 2020

(54) SEMICONDUCTOR DEVICE AND REPAIR OPERATION METHOD THEREOF

(71) Applicant: SK hynix Inc., Gyeonggi-do (KR)

(72) Inventors: Hee-Jin Byun, Gyeonggi-do (KR); Ho-Uk Song, Gyeonggi-do (KR); Sun-Young Hwang, Seoul (KR)

(73) Assignee: SK hynix Inc., Gyeonggi-do (KR)

(*) Notice: Subject to any disclaimer, the term of this patent is extended or adjusted under 35 U.S.C. 154(b) by 55 days.

(21) Appl. No.: 16/129,976

(22) Filed: Sep. 13, 2018

(65) Prior Publication Data
US 2019/0164856 A1   May 30, 2019

(30) Foreign Application Priority Data
Nov. 30, 2017   (KR) .......................... 10-2017-0163393

(51) Int. Cl.
| | | |
|---|---|---|
| G11C 5/06 | (2006.01) |
| G11C 7/00 | (2006.01) |
| G11C 8/00 | (2006.01) |
| H01L 21/66 | (2006.01) |
| H01L 23/498 | (2006.01) |

(Continued)

(52) U.S. Cl.
CPC ........ *H01L 22/22* (2013.01); *H01L 23/49827* (2013.01); *G11C 5/025* (2013.01); *G11C 5/06* (2013.01); *H01L 24/13* (2013.01); *H01L 24/16* (2013.01); *H01L 24/17* (2013.01); *H01L 25/0657* (2013.01); *H01L 2224/13025* (2013.01); *H01L 2224/16146* (2013.01); *H01L 2224/17181* (2013.01);

(Continued)

(58) Field of Classification Search
CPC ... H01L 22/22; H01L 23/49827; H01L 24/13; H01L 24/16; H01L 24/17; H01L 25/0657; H01L 2224/13025; H01L 2224/16146; H01L 2224/17181; H01L 2225/06513; H01L 2225/06541; H01L 2924/37001
USPC ........................................................ 365/63
See application file for complete search history.

(56) References Cited

U.S. PATENT DOCUMENTS

2006/0267221 A1* 11/2006 Allen ...................... H01L 22/22
                                                         257/786
2008/0104457 A1*  5/2008 Iizuka .................. G11C 29/846
                                                         714/710

(Continued)

FOREIGN PATENT DOCUMENTS

| KR | 101038996 | 6/2011 |
| KR | 101519440 | 5/2015 |

*Primary Examiner* — Ly D Pham
(74) *Attorney, Agent, or Firm* — IP & T Group LLP (57) ABSTRACT

A semiconductor device includes a plurality of first signal lines and a plurality of second signal lines which are alternately arranged adjacent to each other, wherein the first signal lines and the second signal lines comprise a plurality of main signal lines and at least one spare signal line, a first signal transmitter suitable for transmitting signals through the main signal lines of the first signal lines, and shifting a signal transmission path to adjacent signal lines among the main signal lines and the spare signal line of the first signal lines, based on repair information, and a second signal transmitter suitable for transmitting signals through the main signal lines of the second signal lines, and shifting a signal transmission path to adjacent signal lines among the main signal lines and the spare signal line of the second signal lines, based on the repair information.

20 Claims, 5 Drawing Sheets

(51) Int. Cl.
  *H01L 25/065* (2006.01)
  *H01L 23/00* (2006.01)
  *G11C 5/02* (2006.01)

(52) U.S. Cl.
  CPC ............... *H01L 2225/06513* (2013.01); *H01L 2225/06541* (2013.01); *H01L 2924/37001* (2013.01)

(56) References Cited

U.S. PATENT DOCUMENTS

| | | | | |
|---|---|---|---|---|
| 2012/0001642 | A1* | 1/2012 | Sylvester | G01R 31/048 324/538 |
| 2012/0195136 | A1* | 8/2012 | Yoko | G11C 5/04 365/189.07 |
| 2012/0313147 | A1* | 12/2012 | Anderson | H01L 23/485 257/204 |
| 2014/0189456 | A1* | 7/2014 | Loh | G01R 31/2812 714/733 |
| 2015/0084689 | A1* | 3/2015 | Lee | G11C 29/025 372/565 |
| 2017/0229381 | A1* | 8/2017 | Kang | H01L 23/481 |
| 2018/0096735 | A1* | 4/2018 | Pappu | G11C 29/14 |
| 2018/0096971 | A1* | 4/2018 | Pappu | G11C 29/48 |
| 2019/0181061 | A1* | 6/2019 | Kang | H01L 23/481 |
| 2019/0342010 | A1* | 11/2019 | Evans | G02B 6/4279 |

* cited by examiner

SEMICONDUCTOR DEVICE AND REPAIR OPERATION METHOD THEREOF

CROSS-REFERENCE TO RELATED APPLICATION

This application claims priority under 35 U.S.C. § 119(a) to Korean Patent Application No. 10-2017-0163393 filed on Nov. 30, 2017, which is incorporated herein by reference in its entirety.

BACKGROUND

1. Field

Exemplary embodiments relate to a semiconductor device, and, more particularly, to a semiconductor device capable of repairing a signal line defect, and an operation method thereof.

2. Discussion of the Related Art

In the semiconductor industry, the packaging technology for manufacturing a product package including a plurality of semiconductor chips has been continuously developing for meeting the demand for size reduction and mounting reliability. Recently, a variety of packaging technologies have been developed for three-dimensionally (3D) stacking of a plurality of semiconductor chips for reducing the size and enhancing the performance of electronic products.

According to a stack method for fabricating a multi-chip package (MCP), two or more semiconductor chips are vertically stacked and connected to each other through bumps and through-electrodes. In such a stack package, signals are transferred through vertical input/output lines formed by the bumps and the through-electrodes. Thus, the stack package can support a high-speed operation of chips and reduce a size of the package. Furthermore, a memory element can be designed to have a memory capacity two times higher than a memory capacity which can be realized in a semiconductor integration process. The stack package has an advantage on the usage efficiency of a mounting area and mounting density as well as the increase of the memory capacity. For this reason, research and development have been actively conducted on the stack package.

Figure 1:
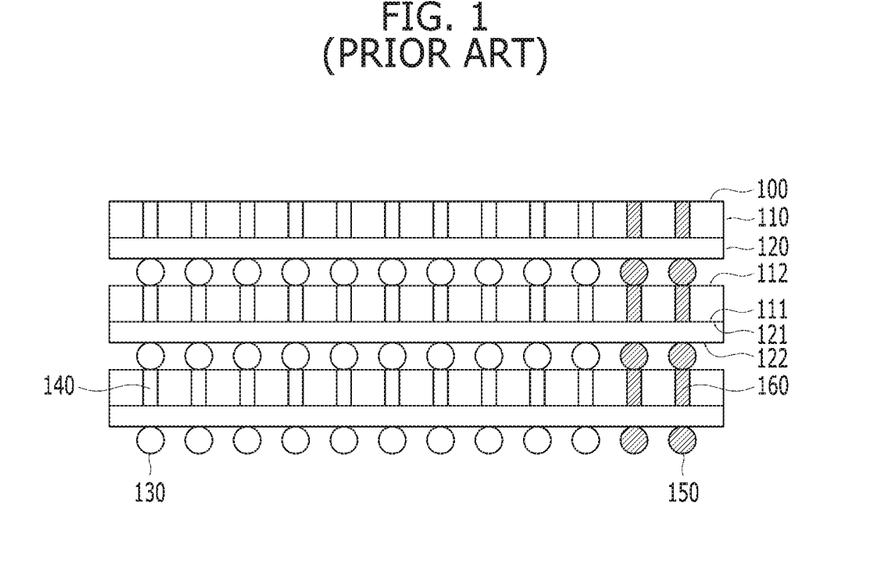
FIG. 1 is a cross-sectional view illustrating a stack package including a plurality of semiconductor chips.

FIG. 1 is a cross-sectional view illustrating a stack package including a plurality of semiconductor chips 100. FIG. 1 illustrates three semiconductor chips 100 which are stacked and connected to each other.

Each of the semiconductor chips 100 includes a semiconductor substrate 110 and a circuit layer 120. The semiconductor substrate 110 has a first surface 111 and a second surface 112 formed at the opposite side of the first surface 111. The circuit layer 120 has a third surface 121 being in contact with the first surface 111 of the semiconductor substrate 110 and a fourth surface 122 formed at the opposite side of the third surface 121.

The semiconductor substrate 110 may be formed of silicon, and the circuit layer 120 may have an integrated circuit (not illustrated) formed therein, depending on chip design. The circuit layer 120 has a plurality of bumps 130 formed on the fourth surface 122. The semiconductor substrate 110 has a plurality of through-electrodes 140 penetrating the first and second surfaces 111 and 112 on the same vertical lines as the respective bumps 130.

The through-electrodes 140 may be formed through a process of forming via holes through the semiconductor substrate 110 and burying a conductive material in the via holes. Each of the through-electrodes 140 is electrically coupled to the bump 130 formed on the same vertical line through signal routing.

That is, the semiconductor chips 100 are stacked in such a manner that the bumps 130 and the through-electrodes 140 are connected to each other. The through-electrodes 140 and the bumps 130 constitute vertical input/output signal lines (herein after also referred to as signal lines) enabling signal transmission between the stacked semiconductor chips 100. The signal lines can transmit signals such as data, addresses, commands, clocks or voltages VDD, VDD, VSS, which are used for chip operations.

While the semiconductor chips 100 are stacked or packaged with other system components, the bumps 130 or the through-electrodes 140 may be opened or a short circuit may occur between adjacent signal lines. Alternatively, a defect such as a short circuit between a signal line and a ball may occur in a procedure for manufacturing a package. When one or two bumps, through-electrodes or balls are not available due to such a defect, the entire package cannot be used. Alternatively, a test may be performed before the semiconductor chips 100 are stacked, and a semiconductor chip 100 having a bump or through-electrode which is determined to be a fail through the test may be not used but discarded.

However, if a semiconductor chip 100 is not used but discarded even though only one of the bumps 130 and the through-electrodes 140 in the semiconductor chip 100 was determined to be a fail, the yield is significantly lowered. Therefore, the stack package may include spare bumps 150 and spare through-electrodes 160 as well as the plurality of bumps 130 and through-electrodes 140, to substitute for a bump or a through-electrode having a defect.

SUMMARY

Various embodiments of the present invention are directed to a semiconductor device which is capable of independently repairing adjacent signal lines in which a defect occurs, thereby reducing a circuit area or power consumption, and an operation method thereof.

In accordance with an embodiment of the present invention, a semiconductor device includes: a plurality of first signal lines and a plurality of second signal lines which are alternately arranged adjacent to each other, wherein the first signal lines and the second signal lines comprise a plurality of main signal lines and at least one spare signal line; a first signal transmitter suitable for transmitting signals through the main signal lines of the first signal lines, and shifting a signal transmission path to adjacent signal lines among the main signal lines and the spare signal line of the first signal lines, based on repair information; and a second signal transmitter suitable for transmitting signals through the main signal lines of the second signal lines, and shifting a signal transmission path to adjacent signal lines among the main signal lines and the spare signal line of the second signal lines, based on the repair information.

In accordance with an embodiment of the present invention, a semiconductor device includes: a plurality of first through-electrodes passing through a first semiconductor chip; a plurality of second through-electrodes passing through the first semiconductor chip and arranged alternately adjacent to the first through-electrodes, wherein the first through-electrodes and the second through-electrodes comprise N main through-electrodes and at least one spare through-electrode, where N is a natural number; a first signal transmitter suitable for transmitting first output signals of the first semiconductor chip through the main through-electrodes of the first through-electrodes, respectively, and transmitting the Kth to last output signals among the first output signals through the (K+1)th to Nth main through-electrodes and the spare through-electrode, respectively, when the Kth main through-electrode has a defect, among the first through-electrodes, where K is a natural number smaller than or equal to N; and a second signal transmitter suitable for transmitting second output signals of the first semiconductor chip through the main through-electrodes of the second through-electrodes, respectively, and transmitting the Kth to last output signals among the second output signals through the (K+1)th to Nth main through-electrodes and the spare through-electrode, when the Kth main through-electrode has a defect, among the second through-electrodes.

DETAILED DESCRIPTION

Various embodiments of the present invention will be described below in more detail with reference to the accompanying drawings. The invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the invention.

Figure 2A:
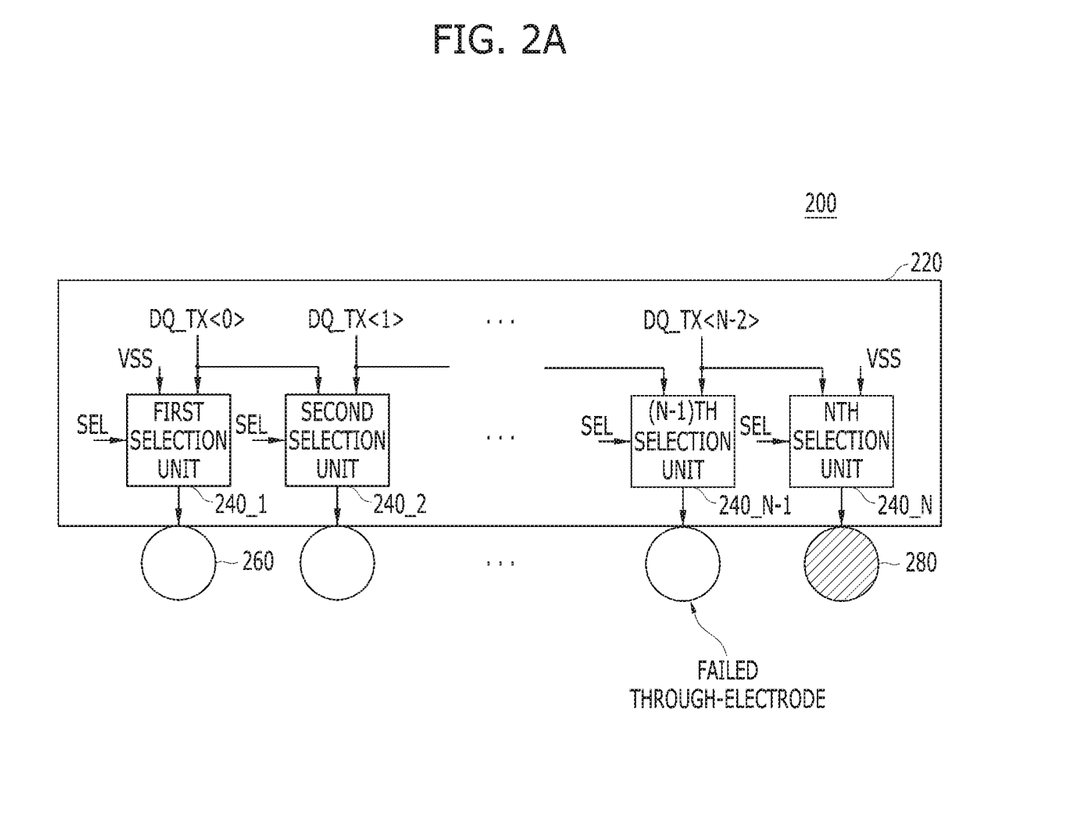
FIGS. 2A and 2B are block diagrams illustrating a semiconductor chip which performs a repair operation.
Figure 2B:
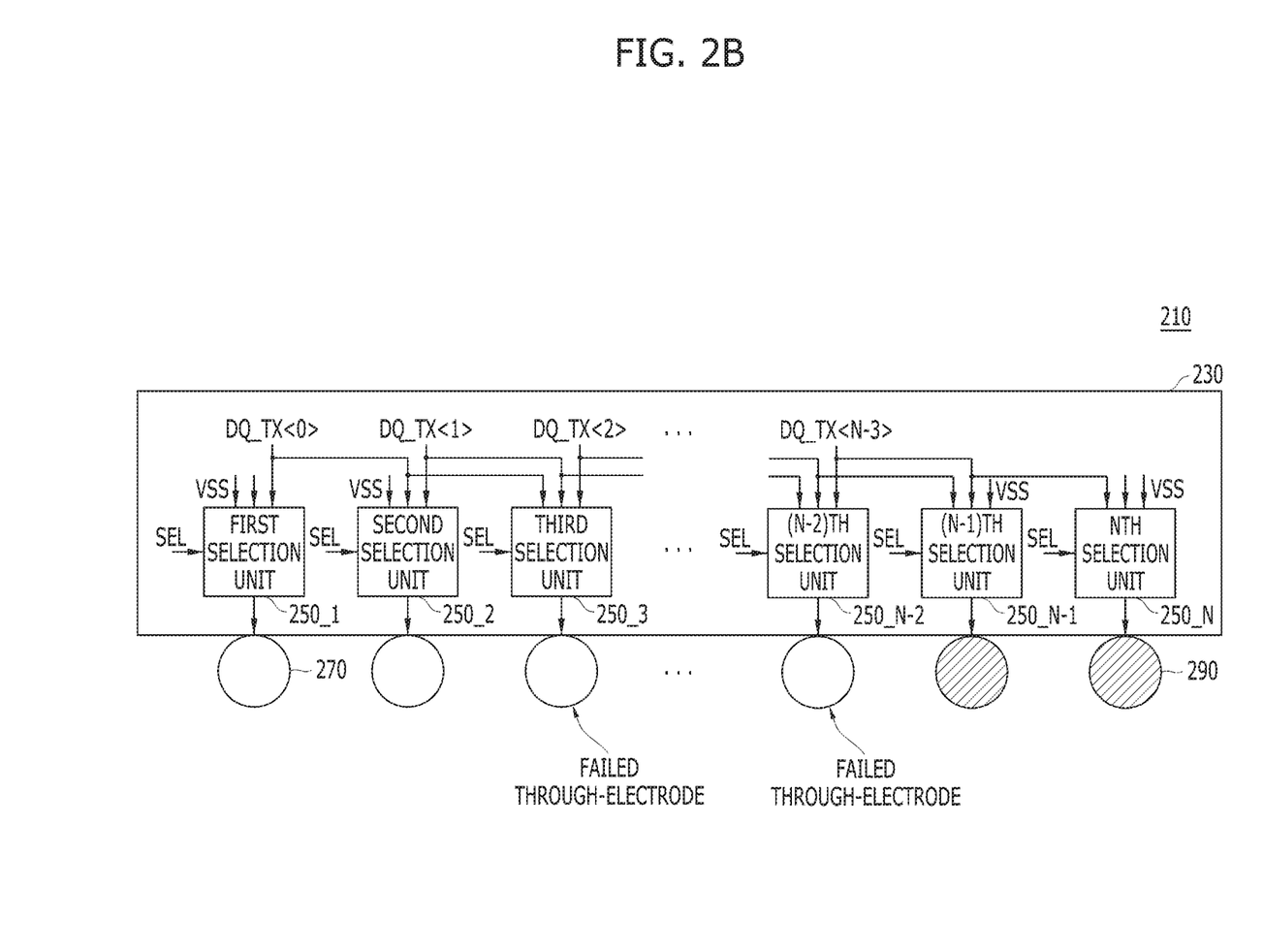

FIGS. 2A and 2B are block diagrams illustrating semiconductor chips which perform a repair operation.

Referring to FIG. 2A, the semiconductor chip 200 may include a signal transmitter 220 and a plurality of through-electrodes 260 to 280. The semiconductor chip 200 may be included in the stacked semiconductor chips illustrated in FIG. 1. Otherwise, a single semiconductor chip 200 may be packaged in accordance with an embodiment. Therefore, the plurality of through-electrodes 260 to 280 may include bumps or balls for signal routing in a single package or a stack package. In the following descriptions, the through-electrodes 260 to 280 will be taken as an example.

The signal transmitter 220 may include a plurality of selection units 240 for connecting output lines DQ_TX of the semiconductor chip 200 to the through-electrodes 260 to 280. The through-electrodes 260, 280 may include a plurality of main through-electrodes 260 and at least one spare through-electrode 280.

By the way of example but not limitation, when the semiconductor chip 200 includes (N−1) output lines DQ_TX<0:N−2>, the semiconductor chip 200 may include (N−1) main through-electrodes 260 corresponding to the (N−1) output lines DQ_TX<0:N−2>. Here, N is a natural number larger than 2. At this time, the signal transmitter 220 may include N selection units 240_1 to 240_N corresponding to the (N−1) main through-electrodes 260 and one spare through-electrode 280. One selection unit 240_N among the N selection units 240_1 to 240_N may correspond to the spare through-electrode 280.

The selection units 240_1 to 240_N may select a signal routing path between the output lines DQ_TX<0:N−2> and the through-electrodes 260, 280. Each of the selection units 240_1 to 240_N may receive signals from the corresponding output line and the output line of the previous stage, select one of the received signals according to a select signal SEL, and output the selected signal to the corresponding through-electrode. By the way of example but not limitation, the Kth selection unit 240_K may receive signals from the (K−1)th and Kth output lines DQ_TX<K−2:K−1>, where K is larger than 1 and less than N, i.e., 1<K<N. Then, the Kth selection unit 240_K may select one of the two signals according to the corresponding select signal SEL. The Kth selection unit 240_K may output the selected signal to the Kth main through-electrode 260.

When the semiconductor chip 200 is normally operated or when no defects occur in the main through-electrodes 260, the first to (N−1)th selection units 240_1 to 240_N−1 may transmit the signals of the output lines DQ_TX<0:N−2> to the main through-electrodes 260, in response to the select signals SEL. At this time, the Nth selection unit 240_N may be disabled, while the spare through-electrode 280 may not be used.

On the other hand, when a defect occurs in the main through-electrodes 260, the select signals SEL may be adjusted to enable the Nth selection unit 240_N, and the spare through-electrode 280 may be used. Specifically, when a defect occurs in the (N−1)th main through-electrode, the (N−1)th selection unit 240_N−1 may be disabled, and the Nth selection unit 240_N may be enabled. The enabled Nth selection unit 240_N may transmit a signal from the output line DQ_TX<N−2> of the previous stage to the spare through-electrode 280.

FIG. 2A illustrates an operation of repairing a failed main through-electrode 260 using one spare through-electrode 280. The operation may be referred to as the 1-shift repair technology. The plurality of selection units 240_1 to 240_N may be implemented with 2:1 multiplexers. According to the 1-shift repair technology, when one specific main through-electrode 260 in use is opened or shorted to the power supply, the main through-electrodes 260 may be shifted one by one to skip the failed main through-electrode 260, and the spare through-electrode 280 at the last stage may be used. However, since the semiconductor chip 200 includes only one spare through-electrode 280, the semiconductor chip 200 cannot handle a situation in which defects occur in two or more main through-electrodes 260.

Referring to FIG. 2B, the semiconductor chip 210 may include a signal transmitter 230 and a plurality of main through-electrodes 270 and a plurality of spare through-electrodes 290. The signal transmitter 230 may include a plurality of selection units 250 for connecting output lines DQ_TX of the semiconductor chip 210 to the through-electrodes 270 and 290. The through-electrodes 270, 290 may include a plurality of main through-electrodes 270 and two spare through-electrodes 290.

By the way of example but not limitation, when the semiconductor chip 210 includes (N−2) output lines DQ_TX<0:N−3>, the semiconductor chip 200 may include (N−2) main through-electrodes 270 corresponding to the (N−2) output lines DQ_TX<0:N−3>. Here, N is a natural number larger than 3. At this time, the signal transmitter 230 may include N selection units 250_1 to 250_N corresponding to the (N−2) main through-electrodes 270 and two spare through-electrodes 290. Two selection units 250_N−1, 250_N among the N selection units 250_1 to 250N may correspond to the spare through-electrodes 290.

Unlike the configuration of FIG. 2A, each of the selection units 250_1 to 250_N may receive signals from the corresponding output line and the output lines of the two previous stages, select one of the signals according to select signals SEL, and output the selected signal to the corresponding through-electrode. By the way of example but not limitation, the K'-th selection unit 250_K' may receive signals from the (K'−2)th to K'-th output lines DQ_TX<K'−3:K'−1>, where K' is larger than 2 and less than N−1, i.e., 2<K'<N−1. Then, the K'-th selection unit 250_K' may select one of the three signals according to the corresponding select signal SEL. The K'-th selection unit 250_K' may output the selected signal to the K'-th main through-electrode 270.

As described above, when no failed main through-electrodes occur, signals of the output lines DQ_TX<0: N−3> may be transmitted to the main through-electrodes 270. That is, the first to (N−2)th selection units 250_1 to 250_N−2 may transmit the signals of the corresponding output lines DQ_TX<0:N−3> to the main through-electrodes 270, in response to the select signals SEL. At this time, the (N−1)th and Nth selection units 250_N−1 and 250_N may be disabled, while the spare through-electrodes 290 may not be used. On the other hand, when a defect occurs in the main through-electrodes 270, the select signals SEL may be adjusted to enable the (N−1)th or Nth selection unit 250_N−1 or 250_N. The spare through-electrode 290 may be used.

FIG. 2B illustrates an operation of repairing a maximum of two failed through-electrodes, for example, the third and (N−2)th main through-electrodes using the two spare through-electrodes 290. In the semiconductor chip 210, a short circuit may occur in adjacent through-electrodes or one through-electrode or between adjacent signal lines. Furthermore, adjacent signal lines may be shorted. In this case, two through-electrodes may not be used. At this time, failed through-electrodes may be replaced with spare ones through the 2-shift repair technology.

As illustrated in FIG. 2B, the 2-shift repair technology connects the output signal lines of the two previous stages to the corresponding selection unit, to prepare for the case in which both the two spare through-electrodes 290 are used. The plurality of selection units 250_1 to 250_N are implemented with 3:1 multiplexers. Furthermore, a burden is laid on the signal lines resulting in reduced signal quality and increased power consumption.

Figure 3:
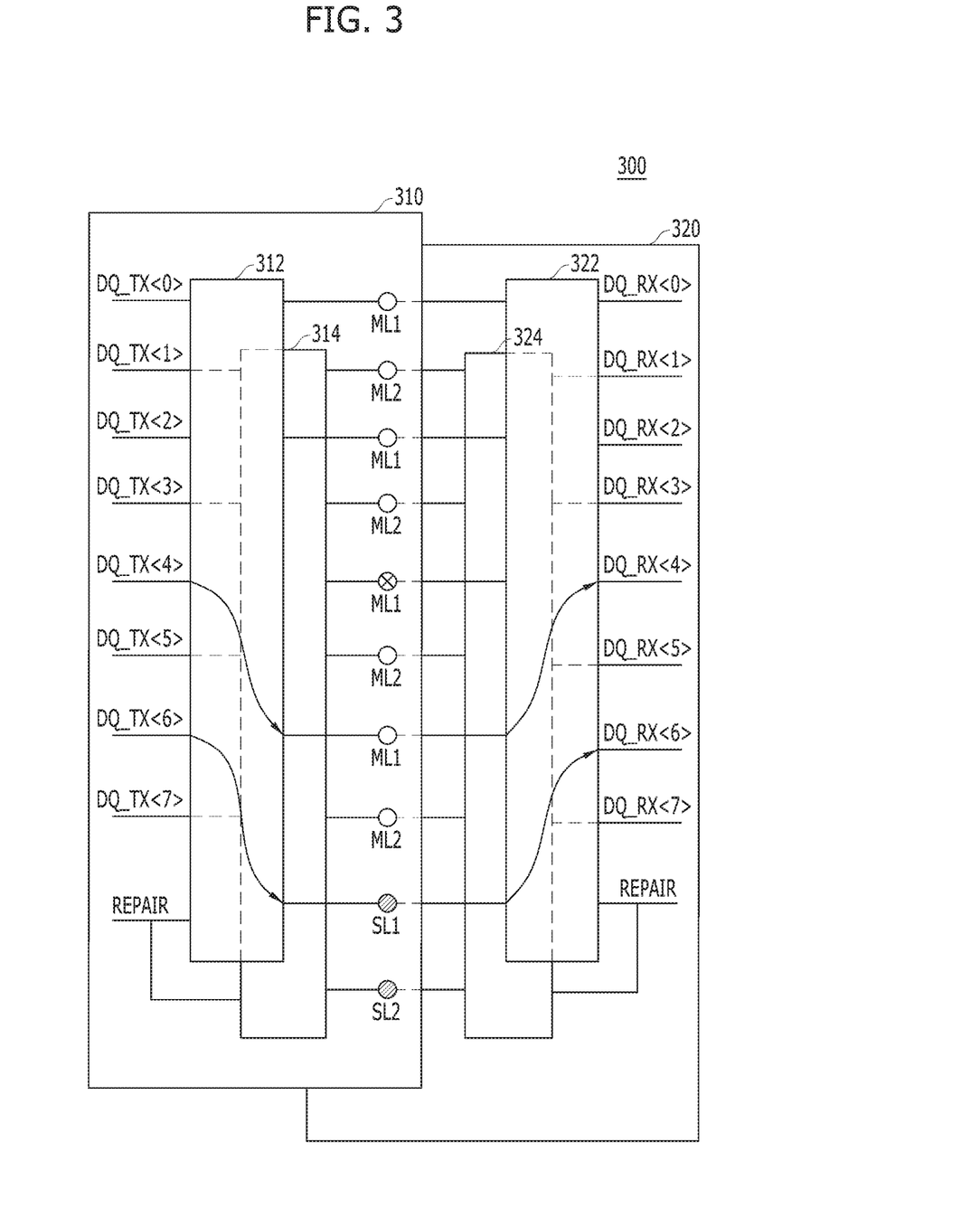
FIG. 3 illustrates a semiconductor device including first and second semiconductor chips, in accordance with an embodiment of the present invention.

FIG. 3 is a block diagram illustrating a semiconductor device 300 in accordance with an embodiment.

The semiconductor device 300 in accordance with the embodiment may include a first semiconductor chip 310. The first semiconductor chip 310 may include a plurality of first signal lines ML1, SL1 and a plurality of second signal lines ML2, SL2, which are alternately arranged adjacent to each other. The first signal lines ML1, SL1 may include a plurality of main signal lines ML1 and one or more spare signal lines SL1. The second signal lines ML2, SL2 may include a plurality of main signal lines ML2 and one or more spare signal lines SL2.

At this time, the signal lines ML1, SL1, ML2, SL2 may include through-electrodes penetrating the first semiconductor chip 310. FIG. 3 illustrates that the first signal lines ML1, SL1 and the second signal lines ML2, SL2 include four main signal lines and one spare signal line. This is an example for description, and the invention is not limited thereto.

The first semiconductor chip 310 may transmit a plurality of output signals DQ_TX<0:7> through the first signal lines ML1, SL1 and the second signal lines ML2, SL2. For this operation, the first semiconductor chip 310 may include a first signal transmitter 312 and a second signal transmitter 314. At this time, the first signal transmitter 312 may transmit odd-numbered output signals DQ_TX<0,2,4,6> through the first signal lines ML1, SL1, and the second signal transmitter 314 may transmit even-numbered output signals DQ_TX<1,3,5,7> through the second signal lines ML2, SL2.

Specifically, the first signal transmitter 312 may form a signal transmission path using the main signal lines ML1 of the first signal lines ML1, SL1. The first signal transmitter 312 may transmit the odd-numbered output signals DQ_TX<0,2,4,6> via the signal transmission path. When a defective signal line occurs among the main signal lines ML1, the first signal transmitter 312 may shift the signal transmission path using the spare signal line SL1 of the first signal lines ML1, SL1. That is, based on repair information REPAIR, the first signal transmitter 312 may shift, or change, the signal transmission path to adjacent signal lines among the main signal lines ML1 and the spare signal line SL1.

The second signal transmitter 314 may form a signal transmission path using the main signal lines ML2 of the second signal lines ML2, SL2. Via the signal transmission path, the second signal transmitter 314 may transmit the even-numbered output signals DQ_TX<1,3,5,7>. When a defective signal line occurs among the main signal lines ML2, the second signal transmitter 314 may shift the signal transmission path using the spare signal line SL2 of the second signal lines ML2, SL2. That is, based on the repair information REPAIR, the second signal transmitter 314 may shift, or change, the signal transmission path to adjacent signal lines among the main signal lines ML2 and the spare signal line SL2.

By the way of example but not limitation, when a defect occurs in the third main signal line ML1 among the main signal lines ML1 of the first signal lines ML1, SL1 as indicated by 'X' in FIG. 3, the first signal transmitter 312 may shift the signal transmission path including the third and fourth main signal lines ML1 to the fourth main signal line ML1 and the spare signal line SL1 one by one, based on the repair information REPAIR. Therefore, the first signal transmitter 312 may transmit the fifth and seventh output signals DQ_TX<4,6> through the fourth main signal line ML1 and the spare signal line SL1, respectively. The second signal transmitter 314 may operate in a similar manner to the first signal transmitter 312. The configurations of the first and second signal transmitters 312, 314 will be described in more detail with reference to FIG. 4.

Referring to FIG. 3, the semiconductor device 300 may further include a second semiconductor chip 320 which is connected to the first semiconductor chip 310 to be stacked over the first semiconductor chip 310.

The second semiconductor chip 320 may receive a plurality of input signals DQ_RX<0:7> through the first signal lines ML1, SL1 and the second signal lines ML2, SL2. For this operation, the second semiconductor chip 320 may include a first signal receiver 322 and a second signal receiver 324. At this time, the first signal receiver 322 may receive odd-numbered input signals DQ_RX<0,2,4,6> through the first signal lines ML1, SL1, but the second signal receiver 324 may receive even-numbered input signals DQ_RX<1,3,5,7> through the second signal lines ML2, SL2.

The first signal receiver 322 may form, or generate, a signal reception path including the main signal lines ML1 of the first signal lines ML1, SL1. The first signal receiver 322 may receive the odd-numbered output signals DQ_TX<0,2, 4,6> via the signal reception path. When a defective signal line occurs among the main signal lines ML1, the first signal receiver 322 may shift the signal reception path using the spare signal line SL1 of the first signal lines ML1, SL1. That is, based on the repair information REPAIR, the first signal receiver 322 may shift, or change, the signal reception path to adjacent signal lines among the main signal lines ML1 and the spare signal line SL1.

The second signal receiver 324 may form a signal reception path including the main signal lines ML2 of the second signal lines ML2 and SL2. The second signal receiver 324 may receive the even-numbered input signals DQ_RX<1,3, 5,7> via the signal reception path. When a defective signal line occurs among the main signal lines ML2, the second signal receiver 324 may shift the signal reception path using the spare signal line SL2 of the second signal lines ML2, SL2. That is, based on the repair information REPAIR, the second signal receiver 324 may shift, or change, the signal reception path to adjacent signal lines among the main signal lines ML2 and the spare signal line SL2.

When a defect occurs in the third main signal line ML1 among the main signal lines ML1 of the first signal lines ML1, SL1 as in the above-described example, the first signal receiver 322 may shift the signal transmission path including the third and fourth main signal lines ML1 to the fourth main signal line ML1 and the spare signal line SL1 one by one, based on the repair information REPAIR. Therefore, the first signal receiver 322 may receive the fifth and seventh input signals DQ_RX<4,6> through the fourth main signal line ML1 and the spare signal line SL1. The second signal receiver 324 may operate in a similar manner to the first signal receiver 322. The configurations of the first and second signal receivers 322 and 324 will be described in more detail with reference to FIG. 5.

The signal lines ML1, SL1, ML2, SL2 may include bumps which are electrically coupled between the first and second semiconductor chips 310, 320. The bumps may be arranged on the same vertical lines as the through-electrodes of the first and second semiconductor chips 310, 320. Stated otherwise, the bumps may be arranged in a vertical alignment with the through-electrodes of the first and second semiconductor chips 310, 320. Therefore, the repair information REPAIR may include information on a through-electrode or bump in which a defect occurs, among the plurality of through-electrodes or the plurality of bumps.

FIG. 3 illustrates that the semiconductor device 300 includes the first and second semiconductor chips 310, 320 stacked therein. However, the semiconductor device 300 in accordance with the embodiment may include a single semiconductor package, that is, the first or second semiconductor chip 310, 320. Thus, the first or second semiconductor chip 310, 320 may include all of the signal transmitters 312, 314 and the signal receivers 322, 324, in order to transmit/receive signals to/from an external device. The first semiconductor chip 310 may include all of the signal transmitters 312 and 314 and the signal receivers 322 and 324. The first semiconductor chip 310 may transmit/receive signals to/from the external device through the first signal lines ML1 and SL1 and the second signal lines ML2 and SL2.

At a first step of the repair operation in accordance with the embodiment, the same kind of signal lines may be divided into even-numbered signal lines and odd-numbered signal lines. That is, signal lines of the same group may not be arranged adjacent to each other. However, signal lines of different groups may be arranged adjacent to each other. At this time, each of the groups may include one or more spare signal lines.

At a second step, the 1-shift repair technology may be applied to each of the groups when a defect occurs. When a single signal line is down or adjacent signal lines are shorted with each other, a defect may occur. This case may correspond to a situation in which a defect occurs in one signal line for each of the different groups even though the adjacent signal lines are shorted.

Therefore, at least one signal line in each of the groups may be skipped, to repair the defective signal line with the spare signal line. One signal line in each of the groups, that is, a total of two defective signal lines may be handled. As described above, there easily occurs the situation in which two signal lines are shorted so as not to be used. Thus, the configuration in accordance with the embodiment can handle the situation without increasing an arrangement of signal lines or a burden in terms of the circuit.

Figure 4:
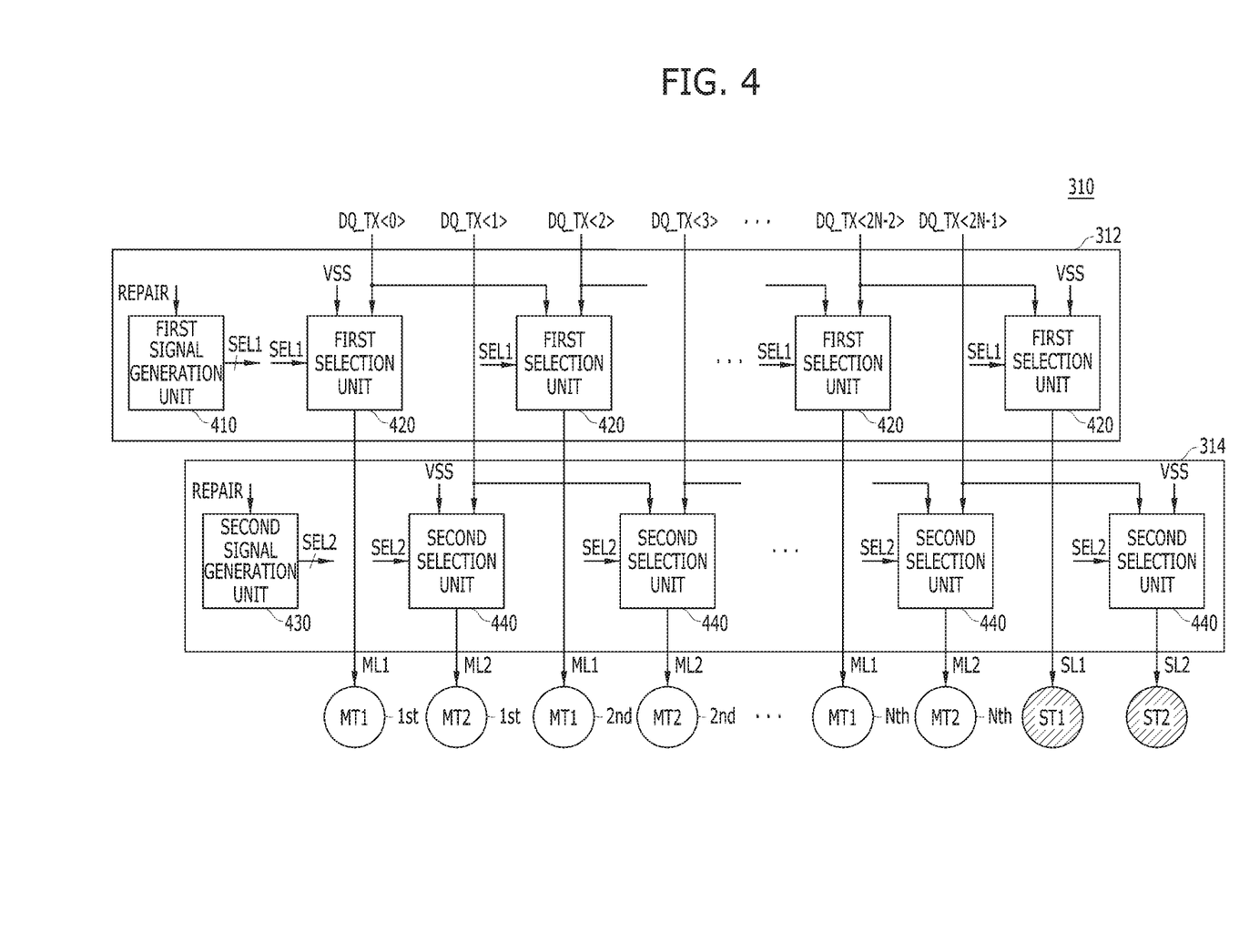
FIG. 4 is a block diagram illustrating an exemplary configuration of the first semiconductor chip of FIG. 3, in accordance with an embodiment of the present invention.

FIG. 4 is a circuit diagram illustrating the first semiconductor chip 310 of FIG. 3. The first semiconductor chip 310 may include a first signal transmitter 312 and a second signal transmitter 314.

The first signal transmitter 312 may include a first signal generation unit 410 and a plurality of first selection units 420. The first signal generation unit 410 may generate a plurality of first select signals SEL1 according to repair information REPAIR. The plurality of first selection units 420 may correspond to the first signal lines ML1, SL1, respectively. Each of the first selection units 420 may select signals of the corresponding signal line or the signal line of the previous stage according to the first select signal SEL1.

FIG. 4 illustrates that the first signal transmitter 312 transmits N odd-numbered output signals DQ_TX<0:2N−2> and the second signal transmitter 314 transmits N even-numbered output signals DQ_TX<1:2N−1>, when the first semiconductor chip 310 transmits 2N output signals DQ_TX<0:2N−1>. Therefore, the first semiconductor chip 310 may include N first main signal lines ML1 and at least one first spare signal line SL1, which correspond to the N odd-numbered output signals DQ_TX<0:2N−2>. Furthermore, the first semiconductor chip 310 may include N second main signal lines ML2 and at least one second spare signal line SL2, which correspond to the N even-numbered output signals DQ_TX<1:2N−1>.

As described above, the first signal lines ML1, SL1 and the second signal lines ML2, SL2 may correspond to first through-electrodes MT1, ST1 and second through-electrodes MT2, ST2 respectively. The first through-electrodes MT1, ST1 and the second through-electrodes MT2, ST2 may be formed to pass through the first semiconductor chip 310. Therefore, the first through-electrodes MT1, ST2 may also include N first main through-electrodes MT1 and at least one first spare through-electrode ST1. The second through-electrodes MT2, ST2 may also include N second main through-electrodes MT2 and at least one second space through-electrode ST2.

The first signal transmitter 312 may transmit the odd-numbered output signals DQ_TX<0:2N−2> through the first main through-electrodes MT1. It can be assumed that a defect occurs in the Kth first main through-electrode MT1 among the first main through-electrodes MT1, where K is equal to, or larger than, 1 and equal to, or less than, N 1≤K≤N. To cure the defect, the first signal transmitter 312 may transmit the Kth to last output signals DQ_TX<2K-2: 2N-2> among the odd-numbered output signals DQ_TX<0: 2N-2> through the (K+1)th to Nth first main through-electrodes MT1 and the first spare through-electrode ST1.

In accordance with the embodiment illustrated in FIG. 4, the first signal transmitter 312 may include (N+1) first selection units 420 corresponding to the first through-electrodes MT1 and ST1. At this time, among the (N+1) first selection units 420, the K'-th first selection unit 420 may receive the K'-th and (K'-1)th output signals among the odd-numbered output signals DQ_TX<0:2N-2>, where K is larger than 1 and less than N+1 1<K<N+1. The K'-th first selection unit 420 may select one of the received output signals in response to the corresponding first select signal SEL1. to output the selected signal to the K'-th through-electrode among the first through-electrodes MT1 and ST1.

On the other hand, the first (K'=1) first selection unit 420 among the (N+1) first selection units 420 may receive only the first output signal DQ_TX<0> among the odd-numbered output signals DQ_TX<0:2N-2>. The first (K'=1) first selection unit 420 may selectively output the first output signal DQ_TX<0> to the first through-electrode among the first through-electrodes MT1, ST1 in response to the corresponding first select signal SEL1. Similarly, the last (K'=N+1) first selection unit 420 among the (N+1) first selection units 420 may receive only the last output signal DQ_TX<2N-2> among the odd-numbered output signals DQ_TX<0:2N-2>, and selectively output the last output signal DQ_TX<2N-2> to the last through-electrode, that is, the first spare through-electrode ST1 among the first through-electrodes MT1, ST1 in response to the corresponding first select signal SEL1.

The operation of the first signal transmitter 312 in accordance with the present embodiment will be described as follows. When no defects occur in the first main through-electrodes MT1, the first signal generation unit 410 may activate, and output, all the first select signals SEL1 according to the repair information REPAIR. In response to the activated first select signals SEL1, the first to Nth first selection units 420 may select the first to Nth output signals DQ_TX<0:2N-2> to output the selected signals to the N first main through-electrodes MT1, respectively. At this time, although the ground voltage VSS is selected by the (N+1)th first selection unit 420 or the last first selection unit 420 and delivered into the first spare through-electrode ST1, the ground voltage VSS may be ignored, or may not affect an operation.

On the other hand, when a defect occurs in the Kth first main through-electrode MT1 among the first main through-electrodes MT1 where 1≤K≤N, the first signal generation unit 410 may activate the first to Kth first select signals SEL1 among the plurality of first select signals SEL1 according to the repair information REPAIR. The first signal generation unit 410 may deactivate the (K+1)th to last first select signals SEL1. In response to the deactivated first select signals SEL1, the (K+1)th to (N+1)th first selection units 420 may select the Kth to Nth output signals DQ_TX<2K-2:2N-2>, and output the selected signals to the (K+1)th to Nth first main through-electrodes MT1 and the first spare through-electrode ST1, respectively. Therefore, the first signal transmitter 312 may transmit the first to (K-1)th output signals DQ_TX<0:2K-4> through the first to (K-1)th first main through-electrodes MT1 among the first through-electrodes MT1 and ST1. The first signal transmitter 312 may transmit the Kth to Nth output signals DQ_TX<2K-2:2N-2> through the (K+1)th to Nth first main through-electrodes MT1 and the first spare through-electrode ST1.

At this time, the select signal SEL1 of the Kth first selection unit 420 corresponding to the failed through-electrode may be activated or deactivated. That is because, although a certain signal is transmitted through the failed through-electrode, the signal reception path can be shifted by the first signal receiver 322 of the second semiconductor chip 320 and the signal can be ignored. This configuration will be described in more detail with reference to FIG. 5.

The second signal transmitter 314 of FIG. 4 may operate in a similar manner to the first signal transmitter 312. The second signal transmitter 314 may transmit the N even-numbered output signals DQ_TX<1:2N-1> among the output signals DQ_TX<0:2N-1> through the N second main through-electrodes MT2. For this operation, the second signal transmitter 314 may include a second signal generation unit 430 and a plurality of second selection units 440.

Therefore, when no failed through-electrodes occur among the second main through-electrodes MT2, the second signal generation unit 430 may activate a plurality of second select signals SEL2 according to the repair information REPAIR. In response to the activated second select signals SEL2, the first to Nth second selection units 440 may select the first to Nth output signals DQ_TX<1:2N-1> to output the selected signals to the N second main through-electrodes MT2, respectively. At this time, although the ground voltage VSS is selected by the (N+1)th second selection unit 440 or the last second selection unit 440 and delivered into the second spare through-electrode ST2, the ground voltage VSS may be ignored.

On the other hand, when a defect occurs in the Kth second main through-electrode MT2 among the second main through-electrodes MT2 where 1≤K≤N, the second signal generation unit 430 may deactivate the second select signal SEL2 following the (K+1)th second select signal SEL2, among the plurality of second select signals SEL2, according to the repair information REPAIR. In response to the deactivated second select signals SEL2, the (K+1)th to (N+1)th second selection units 440 may select the Kth to Nth output signals DQ_TX<2K-1:2N-1> to output the selected signals to the (K+1)th to Nth second main through-electrodes MT2 and the second spare through-electrode ST2, respectively. Therefore, the second signal transmitter 314 may transmit the first to (K-1)th output signals DQ_TX<1: 2K-3> through the first to (K-1)th second main through-electrodes MT2 among the second through-electrodes MT2, ST2, and transmit the Kth to Nth output signals DQ_TX<2K-1:2N-1> through the (K+1)th to Nth second main through-electrodes MT2 and the second spare through-electrode ST2.

Figure 5:
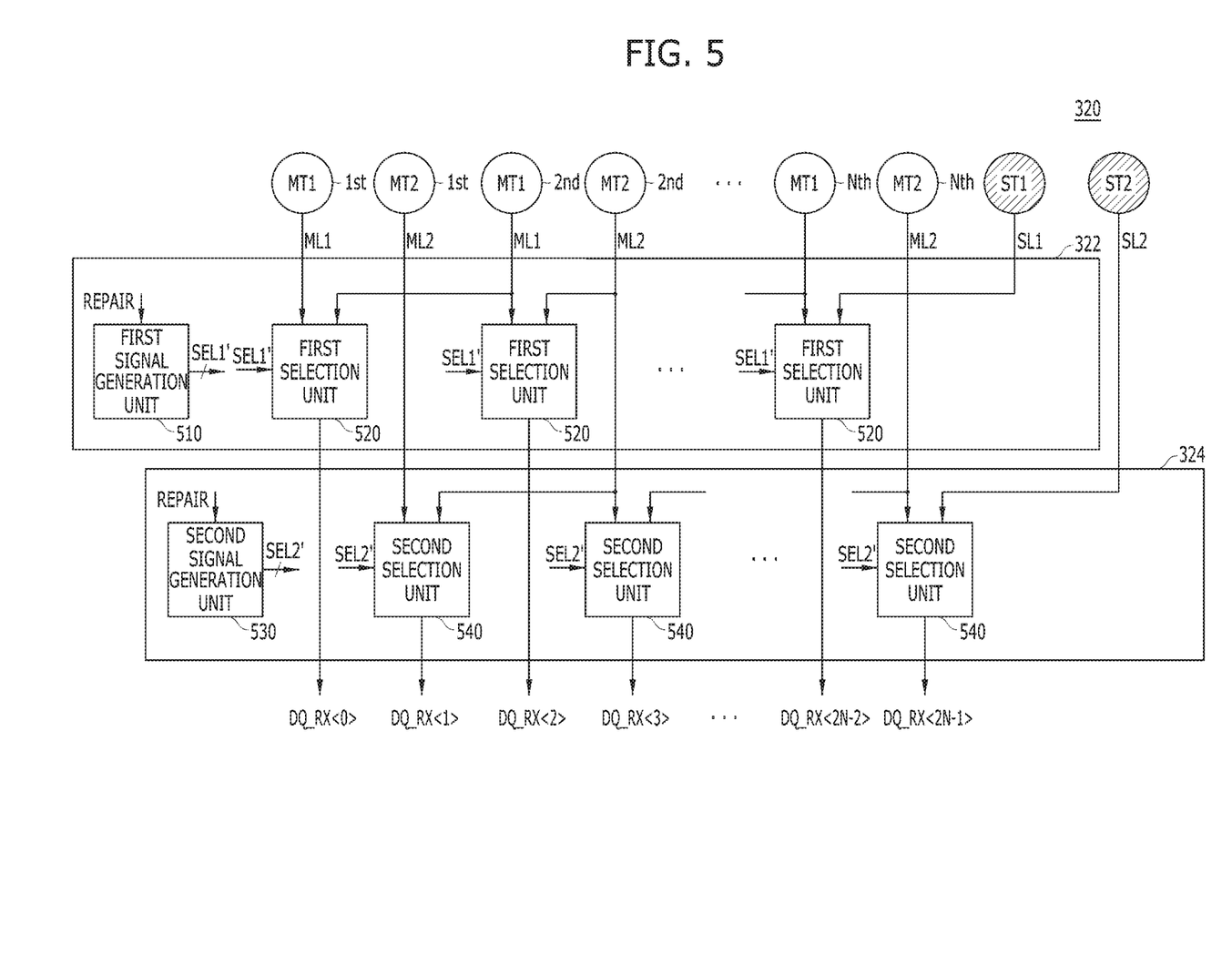
FIG. 5 is a block diagram illustrating an exemplary configuration of the second semiconductor chip shown in FIG. 3.

FIG. 5 is a circuit diagram illustrating the second semiconductor chip 320 of FIG. 3. The second semiconductor chip 320 may include a first signal receiver 322 and a second signal receiver 324.

The first signal receiver 322 may include a first signal generation unit 510 and a plurality of first selection units 520. The first signal generation unit 510 may generate a plurality of first select signals SEL1' according to the repair information REPAIR. The plurality of first selection units 520 may correspond to the first main signal lines ML1, respectively. Each of the first selection units 520 may selectively receive either a signal of the corresponding signal line or the signal line of the previous stage, according to the first select signal SEL1'.

FIG. 5 illustrates that the first signal receiver 322 receives N odd-numbered input signals DQ_RX<0:2N-2> and the second signal receiver 324 receives N even-numbered input signals DQ_RX<1:2N-1>, when the second semiconductor chip 320 receives 2N input signals DQ_RX<0:2N-1>. Therefore, the first signal receiver 322 may receive the N odd-numbered input signals DQ_RX<0:2N-2> through N first main through-electrodes MT1 and at least one first spare through-electrode ST1. The second signal receiver 324 may receive the N even-numbered input signals DQ_RX<1:2N-1> through N second main through-electrodes MT2 and at least one second spare through-electrode ST2.

The first signal receiver 322 may transmit the odd-numbered input signals DQ_RX<0:2N-2> through the first main through-electrodes MT1. At this time, when a defect occurs in the Kth first main through-electrode MT1 among the first main through-electrodes MT1 where 1≤K≤N, the first signal receiver 322 may receive the Kth to last input signals DQ_RX<2K-2:2N-2> among the odd-numbered output signals DQ_RX<0:2N-2> through the (K+1)th to Nth first main through-electrodes MT1 and the first spare through-electrode ST1.

In accordance with the embodiment illustrated in FIG. 5, the first signal receiver 322 may include N first selection units 520 corresponding to the first main through-electrodes MT1. At this time, the Kth first selection unit 520 among the N first selection units 520 may receive signals of the corresponding through-electrode and the through-electrodes of the following stages, among the first through-electrodes MT1, ST1. The Kth first selection unit 520 may select one of the received signals and output the selected signal as the Kth input signal DQ_RX<2K-2>, in response to the corresponding first select signal SEL1'.

The operation of the first signal receiver 322 in accordance with the present embodiment will be described as follows. When no failed through-electrodes occur among the first main through-electrodes MT1, the first signal generation unit 510 may activate the plurality of first select signals SEL1' according to the repair information REPAIR. In response to the activated first select signals SEL1', the first to Nth first selection units 520 may output signals transmitted from the first to Nth first main through-electrodes MT1, respectively, as the first to Nth input signals DQ_RX<0:2N-2>.

On the other hand, when a defect occurs in the Kth first main through-electrode MT1 among the first main through-electrodes ML1, the first signal generation unit 510 may deactivate the first select signals SEL1' following the Kth first select signal SEL1' among the plurality of first select signals SEL1', according to the repair information REPAIR. In response to the deactivated first select signals SEL1°, the Kth to Nth first selection units 520 may output signals transmitted from the (K+1)th to Nth first main through-electrodes MT1 and the first spare through-electrode ST1 as the Kth to Nth input signals DQ_RX<2K-2:2N-2>. Therefore, the first signal receiver 322 may receive the first to (K-1)th input signals DQ_RX<0:2K-4> through the first to (K-1)th first main through-electrodes MT1 among the first through-electrodes MT1 and ST1. The first signal receiver 322 may receive the Kth to Nth input signals DQ_RX<2K-2:2N-2> through the (K+1)th to Nth first main through-electrodes MT1 and the first spare through-electrode ST1.

The second signal receiver 324 of FIG. 5 may operate in a similar manner to the first signal receiver 322. The second signal receiver 324 may receive the N even-numbered input signals DQ_RX<1:2N-1> among the input signals DQ_RX<0:2N-1> through the N second main through-electrodes MT2. For this operation, the second signal receiver 324 may include a second signal generation unit 530 and a plurality of second selection units 540.

Therefore, when no failed through-electrodes occur among the second main through-electrodes MT2, the second signal generation unit 530 may activate a plurality of second select signals SEL2' according to the repair information REPAIR. In response to the activated second select signals SEL2', the first to Nth second selection units 540 may output signals, transmitted from the N second main through-electrodes MT2, as the first to Nth input signals DQ_RX<1:2N-1> respectively.

On the other hand, when a defect occurs in the Kth second main through-electrode MT2 among the second main through-electrodes MT2, the second signal generation unit 530 may deactivate the second select signals SEL2' following the Kth second select signal SEL2' among the plurality of second select signals SEL2', according to the repair information REPAIR. In response to the deactivated second select signals SEL2', the Kth to Nth second selection units 540 may output signals transmitted from the (K+1)th to Nth second main through-electrodes MT2 and the second spare through-electrode ST2 as the Kth to Nth input signals DQ_RX<2K-1:2N-1>, respectively. Therefore, the second signal receiver 324 may receive the first to (K-1)th input signals DQ_RX<1:2K-3> through the first to (K-1)th second main through-electrodes MT2 among the second through-electrodes MT2, ST2. The second signal receiver 324 may receive the Kth to Nth input signals DQ_RX<2K-1:2N-1> through the (K+1)th to Nth second main through-electrodes MT2 and the second spare through-electrode ST2.

As described above, when a short circuit occurs between adjacent through-electrodes or input/output lines in a semiconductor device, the short circuit may be considered a defect in each of the through-electrodes or input/output lines. At this time, a repair operation in accordance with an embodiment of the present invention, may independently replace the defective through-electrodes having a defect with spare through-electrodes. Therefore, when a defect is repaired among a plurality of failed through-electrodes adjacent to each other, which are highly likely to occur, the semiconductor device can perform a repair operation without increasing the area or additionally consuming power.

When the repair operation in accordance with the embodiment is applied, two or more defective signal lines may be replaced without an additional burden in the signal line arrangement. That is, it is possible to avoid an increase in circuit area or signal routing complexity of the semiconductor device, which may occur when plural defective signal lines are cured. Furthermore, it is possible to handle the plurality of defective signal lines with power consumption required for repairing a single defective signal line. Moreover, the repair operation may be effectively used to repair or cure defects of input/output pads or through-electrodes corresponding to signal lines.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   a plurality of first signal lines and a plurality of second signal lines which are alternately arranged adjacent to each other on a first semiconductor chip, wherein the first signal lines and the second signal lines comprise a plurality of main signal lines and at least one spare signal line;

a first signal transmitter configured to transmit signals through the main signal lines of the first signal lines, and shift a signal transmission path to adjacent signal lines among the main signal lines and the spare signal line of the first signal lines, based on repair information; and a second signal transmitter configured to transmit signals through the main signal lines of the second signal lines, and shift a signal transmission path to adjacent signal lines among the main signal lines and the spare signal line of the second signal lines, based on the repair information, wherein each first signal line is connected to the first transmitter, beginning with an initial first signal line connected to a first end of the first transmitter, wherein each second signal line is connected to the second transmitter, beginning with an initial second signal line connected to a first end of the second transmitter and adjacent to the initial first signal line, and wherein each subsequent first signal line and each subsequent second signal line are alternately connected to the first transmitter and the second transmitter respectively, until a last spare signal line of the first signal lines is connected at a second end of the first transmitter opposite to the first end, and a last spare signal line of the second signal lines is connected at a second end of the second transmitter opposite to the first end.

2. The semiconductor device of claim 1, wherein each of the first and second signal transmitters comprises:
a signal generation circuit configured to generate a plurality of select signals according to the repair information; and
a plurality of selection circuits configured to receive the select signals, and corresponding to the main signal lines and the spare signal line, respectively.

3. The semiconductor device of claim 2, wherein the selection circuits select a signal line of a corresponding or previous stage and output a signal of the selected signal line, in response to the select signals.

4. The semiconductor device of claim 2, wherein each of the selection circuits comprises a multiplexer operated in response to the corresponding select signal.

5. The semiconductor device of claim 1, further comprising:
a first signal receiver configured to receive signals through the main signal lines of the first signal lines, and shift a signal reception path to adjacent signal lines among the main signal lines and the spare signal line of the first signal lines, based on the repair operation; and
a second signal receiver configured to receive signals through the main signal lines of the second signal lines, and shift a signal reception path to adjacent signal lines among the main signal lines and the spare signal line of the second signal lines, based on the repair operation.

6. The semiconductor device of claim 5, wherein each of the first and second signal receivers comprises:
a signal generation circuit suitable for generating a plurality of select signals according to the repair information; and
a plurality of selection circuits suitable for receiving the select signals, and corresponding to the main signal lines, respectively.

7. The semiconductor device of claim 6, wherein the selection circuit selects a signal line of a corresponding or following stage and receives a signal of the selected line, in response to the select signals.

8. The semiconductor device of claim 1,
wherein the semiconductor device includes a semiconductor package having a plurality of bumps corresponding to the first and second signal lines, and
wherein the repair information comprises information on a defective bump among the plurality of bumps.

9. The semiconductor device of claim 1, further comprising:
a plurality of semiconductor chips stacked to transmit and receive signals through the first and second signal lines,
wherein each of the semiconductor chips includes a plurality of through-electrodes corresponding to the first and second signal lines, respectively.

10. The semiconductor device of claim 9, wherein the repair information comprises information on a defective through-electrode among the plurality of through-electrodes.

11. A semiconductor device comprising:
a plurality of first through-electrodes passing through a first semiconductor chip;
a plurality of second through-electrodes passing through the first semiconductor chip and arranged alternately adjacent to the first through-electrodes, wherein the first through-electrodes and the second through-electrodes comprise N main through-electrodes and at least one spare through-electrode, where N is a natural number;
a first signal transmitter configured to transmit first output signals of the first semiconductor chip through the main through-electrodes of the first through-electrodes, respectively, and transmit the Kth to last output signals among the first output signals through the (K+1)th to Nth main through-electrodes and the spare through-electrode, respectively, when the Kth main through-electrode has a defect, among the first through-electrodes, where K is a natural number smaller than or equal to N; and
a second signal transmitter configured to transmit second output signals of the first semiconductor chip through the main through-electrodes of the second through-electrodes, respectively, and transmit the Kth to last output signals among the second output signals through the (K+1)th to Nth main through-electrodes and the spare through-electrode, when the Kth main through-electrode has a defect, among the second through-electrodes.

12. The semiconductor device of claim 11, wherein the first signal transmitter comprises:
a signal generation circuit configured to generate a plurality of select signals according to repair information; and
a plurality of selection circuits configured to receive the select signals, and corresponding to the main through-electrodes and the spare through-electrode of the first through-electrodes, respectively.

13. The semiconductor device of claim 12, wherein the selection circuits select and output an output signal of a corresponding or previous order among the first output signals, in response to the select signals.

14. The semiconductor device of claim 12, wherein when the Kth main through-electrode has the defect, the signal generation circuit activates the first to Kth select signals and deactivates the (K+1)th to last select signals, among the select signals.

15. The semiconductor device of claim 14, wherein the (K+1)th to last selection circuits among the selection circuits output the Kth to last output signals to the (K+1)th to Nth main through-electrodes and the spare through-electrode, respectively, in response to the deactivated (K+1)th to last select signals.

16. The semiconductor device of claim 14, wherein the first to Kth selection circuits among the selection circuits output the first to Kth output signals among the first output signals to the first to Kth main through-electrodes among the main through-electrodes, respectively, in response to the activated first to Kth select signals.

17. The semiconductor device of claim 11, further comprising:
- a first signal receiver configured to receive first input signals of the first semiconductor chip through the main through-electrodes of the first through-electrodes, respectively, and receive the Kth to last input signals among the first input signals through the (K+1)th to Nth main through-electrodes and the spare through-electrode, respectively, when the Kth main through-electrode has a defect, among the first through-electrodes; and
- a second signal receiver configured to receive second input signals of the first semiconductor chip through the main through-electrodes of the second through-electrodes, respectively, and receive the Kth to last input signals among the second input signals through the (K+1)th to Nth main through-electrodes and the spare through-electrode, respectively, when the Kth main through-electrode has a defect, among the second through-electrodes.

18. The semiconductor device of claim 17, wherein the first signal receiver comprises:
- a signal generation circuit configured to output a plurality of select signals according to repair information; and
- a plurality of selection circuits configured to receive the select signals, and corresponding to the main through-electrodes of the first through-electrodes, respectively, wherein the selection circuits select a through-electrode of a corresponding or following stage among the first through-electrodes and receives a signal of the selected through-electrode, in response to the select signals.

19. The semiconductor device of claim 11, further comprising:
- a second semiconductor chip stacked over the first semiconductor chip;
- a plurality of first bumps, electrically coupled between the first and second semiconductor chips and arranged in vertical alignment with the first through-electrodes; and
- a plurality of second bumps, electrically coupled between the first and second semiconductor chips and arranged in vertical alignment with the second through-electrodes.

20. The semiconductor device of claim 19, wherein when the Kth bump among the first bumps has a defect, the first signal transmitter transmits the Kth to last output signals among the first output signals through the (K+1)th to Nth main through-electrodes and the spare through-electrode, and wherein when the Kth bump among the second bumps has a defect, the second signal transmitter transmits the Kth to last output signals among the second output signals through the (K+1)th to Nth main through-electrodes and the spare through-electrode.

* * * * *